(12) United States Patent
Chen

(10) Patent No.: US 9,509,119 B2
(45) Date of Patent: Nov. 29, 2016

(54) TUNABLE LASER WITH A CASCADED FILTER AND COMB REFLECTOR

(71) Applicant: Futurewei Technologies, Inc., Plano, TX (US)

(72) Inventor: Hongmin Chen, Davis, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 14/962,990

(22) Filed: Dec. 8, 2015

(65) Prior Publication Data

US 2016/0204576 A1 Jul. 14, 2016

Related U.S. Application Data

(60) Provisional application No. 62/102,782, filed on Jan. 13, 2015.

(51) Int. Cl.
*H01S 3/10* (2006.01)
*H01S 5/06* (2006.01)
*H01S 5/00* (2006.01)
(Continued)

(52) U.S. Cl.
CPC ........... *H01S 5/0612* (2013.01); *H01S 3/1062* (2013.01); *H01S 5/0014* (2013.01); *H01S 5/3013* (2013.01)

(58) Field of Classification Search
CPC ... H01S 3/1062; H01S 5/3013; H01S 5/0014
USPC ......................................................... 372/20
See application file for complete search history.

(56) References Cited

U.S. PATENT DOCUMENTS

| 6,975,798 B2 | 12/2005 | Blauvelt et al. |
| 2003/0012250 A1* | 1/2003 | Shirasaki ............ G02B 26/001 372/98 |
| 2010/0189143 A1* | 7/2010 | Fukuda .................. H01S 5/026 372/20 |

(Continued)

FOREIGN PATENT DOCUMENTS

| CN | 103532009 A | 1/2014 |
| JP | 2011171355 A | 9/2011 |
| JP | 2013093627 A | 5/2013 |

OTHER PUBLICATIONS

Segawa, et al., "A Novel Tunable Laser with Flat-Output Wideband Tuning Based on Parallel Ring Resonaters," Sep. 11, 2012, 3 pages.

(Continued)

*Primary Examiner* — Tuan Nguyen
(74) *Attorney, Agent, or Firm* — Conley Rose, P.C.

(57) ABSTRACT

A laser comprises a gain medium, and a mirror coupled to the gain medium and comprising a coupler coupled to the gain medium, a phase section coupled to the coupler, a bandpass filter coupled to the phase section, and a comb reflector (CR) coupled to the bandpass filter. A laser chip package comprises a substrate, and a laser coupled to the substrate and comprising a filter comprising a first interferometer with a first transmittance, and a second interferometer with a second transmittance, wherein the filter is configured to provide a filter transmittance based on the first transmittance and the second transmittance, and a comb reflector (CR) coupled to the filter and comprising a ring with a circumference, and a refractive index, wherein the CR is configured to provide a CR reflectivity based on the circumference and the refractive index.

17 Claims, 13 Drawing Sheets

(51) Int. Cl.
   *H01S 3/106* (2006.01)
   *H01S 5/30* (2006.01)

(56) References Cited

U.S. PATENT DOCUMENTS

2014/0010248 A1 1/2014 Larson
2014/0348187 A1 11/2014 Chen et al.

OTHER PUBLICATIONS

Cunningham, et al., "Highly-Efficient Thermally-Tuned Resonant Optical Filters," Optics Express, Optical Society of America, vol. 18, No. 18, Aug. 23, 2010, pp. 19055-19063.
Jones, et al., "Net Continuous Wave Optical Gain in a Low Loss Silicon-on-Insulator Waveguide by Stimulated Raman Scattering," Optics Express, Optical Society of America, vol. 13, No. 2, Jan. 24, 2005, pp. 519-525.
Segawa, et al., "Semiconductor Double-Ring-Resonator-Coupled Tunable Laser for Wavelength Routing," IEEE Journal of Quantum Electronics, vol. 45, No. 7, Jul. 2009, pp. 892-899.
Partial English Translation and Abstract of Japanese Patent Application No. JP2011171355, Part 1, Apr. 28, 2016, 9 pages.
Partial English Translation and Abstract of Japanese Patent Application No. JP2011171355, Part 2, Apr. 28, 2016, 4 pages.
Foreign Communication From a Counterpart Application, PCT Application No. PCT/CN2015/098456, English Translation of International Search Report dated Mar. 1, 2016, 8 pages.
Foreign Communication From a Counterpart Application, PCT Application No. PCT/CN2015/098456, English Translation of Written Opinion dated Mar. 16, 2016, 4 pages.

\* cited by examiner

TUNABLE LASER WITH A CASCADED FILTER AND COMB REFLECTOR

CROSS-REFERENCE TO RELATED APPLICATIONS

This application claims priority to U.S. provisional patent application No. 62/102,782 filed Jan. 13, 2015 by Hongmin Chen and titled "Hybrid Integrated Tunable Laser Without Using Vernier Effect," which is incorporated by reference.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Tunable lasers, which are lasers that may be tuned to emit light at various wavelengths, are widely used in optical communications. It is desirable for tunable lasers to be able to emit light across the full C band, which refers to the spectrum between about 1,528 nanometers (nm) and about 1,565 nm. Different approaches are used to achieve full C-band tunability. One approach is a monolithically-integrated laser, which comprises both a gain medium and a cavity formed on an indium phosphide (InP) substrate. Another approach is an external cavity laser, which comprises a cavity constructed of bulk optics, a collimator lens, a liquid crystal or microelectromechanical systems (MEMS) tunable mirrors, and other components. It is also desirable to achieve full C-band tunability with accuracy and power conservation.

SUMMARY

In one embodiment, the disclosure includes a laser comprising a gain medium; and a mirror coupled to the gain medium and comprising: a coupler coupled to the gain medium; a phase section coupled to the coupler; a bandpass filter coupled to the phase section; and a comb reflector (CR) coupled to the bandpass filter.

In some embodiments, the bandpass filter comprises: a first Mach-Zehnder interferometer (MZI); and a second MZI coupled to the first MZI and the CR.

In some embodiments, the first MZI comprises: a first splitter; a first local heater coupled to the first splitter; and a second splitter coupled to the first splitter and the first local heater.

In some embodiments, the second MZI comprises: a third splitter coupled to the second splitter; a second local heater coupled to the third splitter; and a fourth splitter coupled to the third splitter and the second local heater.

In some embodiments, the CR comprises: a first splitter coupled to the bandpass filter; and a ring comprising: a second splitter coupled to the first splitter; a local heater coupled to the second splitter; and a third splitter coupled to the local heater and the second splitter.

In some embodiments, the gain medium comprises a facet that is a thin-film coating reflector.

In some embodiments, the phase section comprises a local heater and a p-n junction.

In some embodiments, the gain medium comprises indium phosphide (InP) and the mirror comprises a silicon (Si) waveguide.

In some embodiments, the laser further comprises: a local heater; and a suspended structure thermally coupled to the local heater, wherein the Si waveguide is positioned between the local heater and the suspended structure.

In some embodiments, the laser further comprises a first photodiode (PD) coupled to the bandpass filter; a second PD coupled to the bandpass filter; a local heater coupled to the CR; a third PD coupled to the local heater; and a fourth PD coupled to the CR.

In some embodiments, the gain medium is evanescently coupled to the mirror.

In some embodiments, the laser further comprises a waveguide structure comprising: an n-doped rib; a positive electrode coupled to the n-doped rib; a p-doped rib; a ground electrode coupled to the p-doped rib; and a silicon (Si) waveguide positioned between the n-doped rib and the p-doped rib to form a PIN diode.

In another embodiment, a laser chip package comprises: a substrate; and a laser coupled to the substrate and comprising: a filter comprising: a first interferometer with a first transmittance; and a second interferometer with a second transmittance, wherein the filter is configured to provide a filter transmittance based on the first transmittance and the second transmittance; and a comb reflector (CR) coupled to the filter and comprising: a ring with a circumference; and a refractive index, wherein the CR is configured to provide a CR reflectivity based on the circumference and the refractive index.

In some embodiments, the laser further comprises a mirror configured to provide a mirror reflectivity based on the filter transmittance and the CR reflectivity.

In some embodiments, the laser further comprises a gain section configured to provide a round-trip gain peak, wherein the mirror reflectivity has a mirror reflectivity peak, and wherein the laser is configured to lase at a wavelength based on the round-trip gain peak and the mirror reflectivity peak.

In some embodiments, the laser chip package further comprises a phase section coupled to the filter and comprising: a local heater configured to provide slower phase tuning; and a p-n junction coupled to the local heater and the filter and configured to provide faster phase tuning.

In yet another embodiment, the disclosure includes a method of tuning a laser, the method comprising: tuning a bandpass filter to make a first wavelength corresponding to a transmittance peak of the bandpass filter the same as a target wavelength; and tuning a comb reflector (CR) to make a second wavelength corresponding to a reflectivity peak of the CR the same as the target wavelength.

In some embodiments, the method further comprises determining that the first wavelength or the second wavelength is not the same as the target wavelength; tuning a phase section of the laser so that a round-trip optical path length is an integer multiple of the target wavelength; and tuning a local heater to minimize a ratio of a first photocurrent exiting an interferometer of the bandpass filter to a second photocurrent exiting the CR.

In some embodiments, the tuning the bandpass filter and the tuning the CR provide coarse tuning, and wherein the determining, the tuning the phase section, and the tuning the local heater provide fine tuning.

In some embodiments, the method further comprises performing the coarse tuning based on a lookup table generated before regular data communication begins; and performing the fine tuning based on a first photodiode (PD) measuring the first photocurrent and a second PD measuring the second photocurrent after regular data communications begins.

The embodiments above may be combined in any manner to create a new embodiment within the scope of the disclosure.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 1:
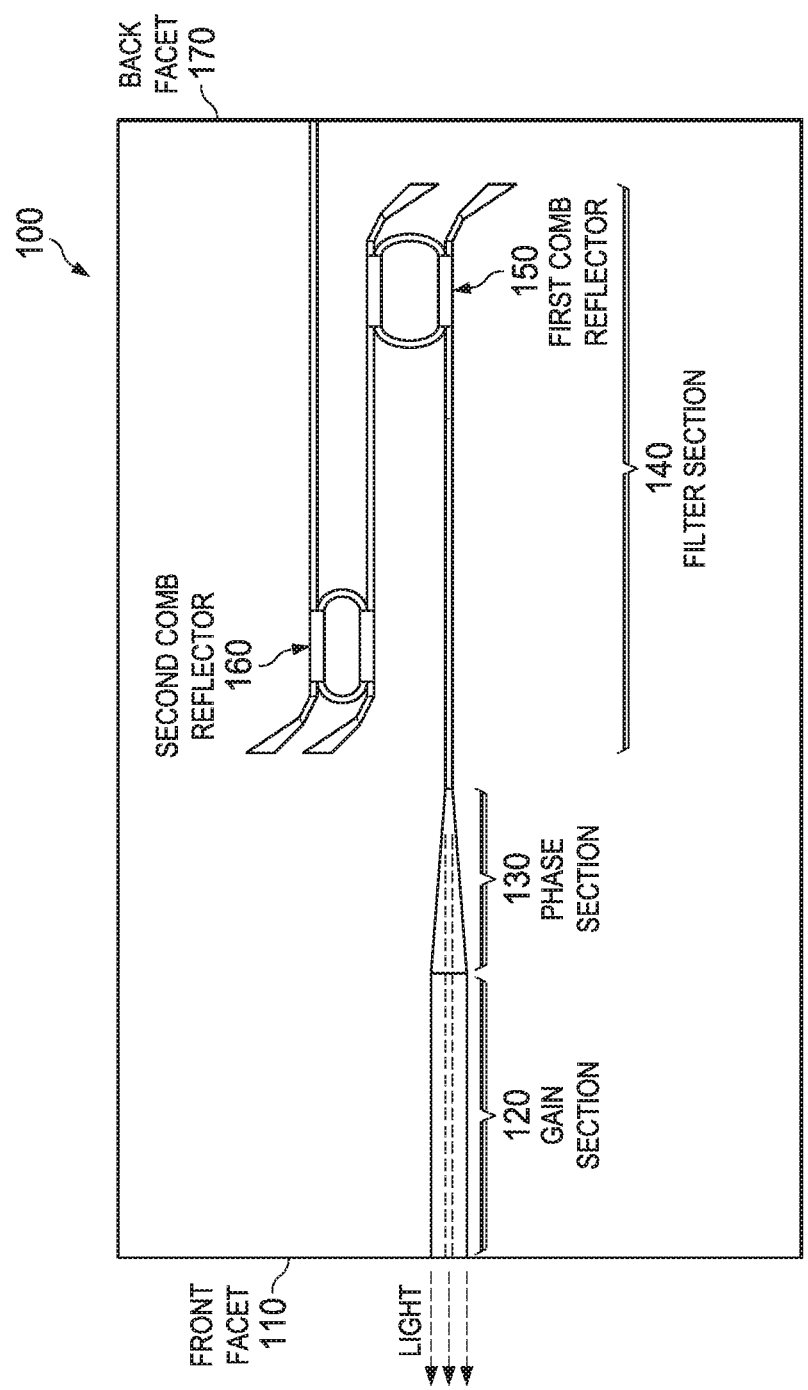
FIG. 1 is a schematic diagram of a tunable laser.

FIG. 1 is a schematic diagram of a tunable laser 100. The laser 100 is described in Toru Segawa, et al., "Semiconductor Double-Ring-Resonator-Coupled Tunable Laser for Wavelength Routing," Institute of Electrical and Electronics Engineers (IEEE) Journal of Quantum Electronics, Vol. 45, No. 7, July 2009, which is incorporated by reference. The laser 100 is a monolithically-integrated laser. The laser 100 comprises a front facet 110, a gain section 120, a phase section 130, a filter section 140, and a back facet 170. The filter section 140 comprises a first comb reflector (CR) 150 and a second CR 160. The first CR 150 and the second CR 160 are either ring resonators or distributed Bragg reflectors (DBRs). The laser 100 lases and emits light out of the front facet 110 to the left of the page as shown.

Figure 2:
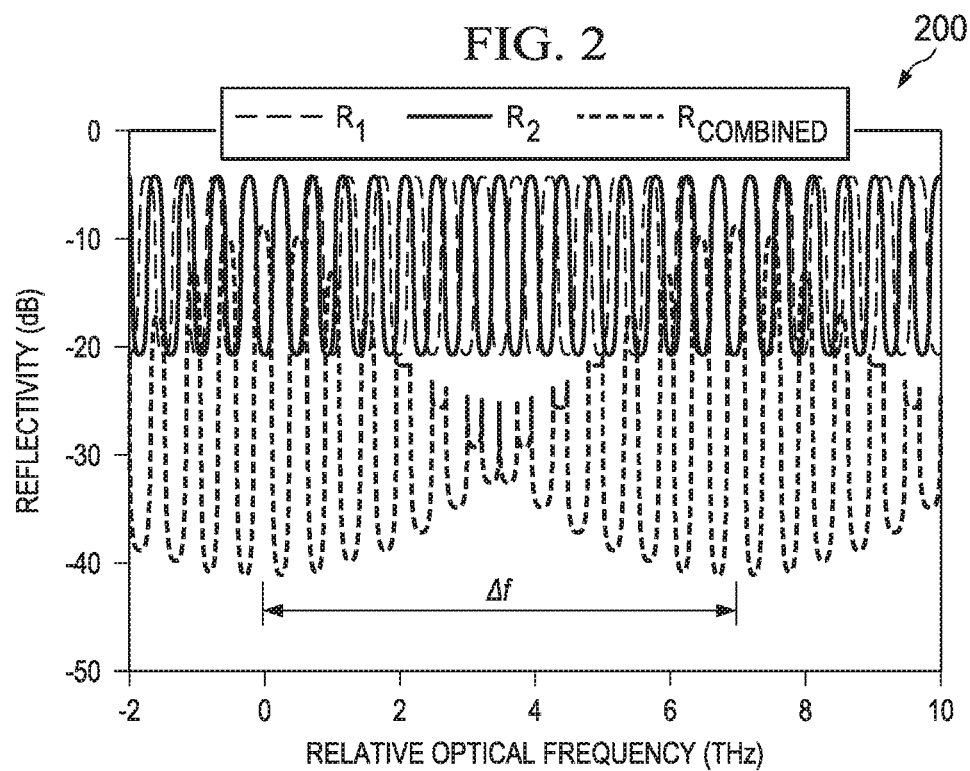
FIG. 2 is a graph of reflectivity versus relative frequency for the laser in FIG. 1.

FIG. 2 is a graph 200 of reflectivity versus relative frequency for the laser 100 in FIG. 1. The x-axis represents relative frequency in units of terahertz (THz), and the y-axis represents reflectivity in units of decibels (dB). The graph 200 shows $R_1$, the reflectivity of the first CR 150; $R_2$, the reflectivity of the second CR 160; and $R_{combined}$, the combined reflectivity of the first CR 150 and the second CR 160. Free spectral range (FSR), which may be used interchangeably with comb spacing, wavelength spacing, and reflectivity peak spacing in this context, refers to the spacing between maxima of a reflectivity curve. $R_1$ has a first FSR, $FSR_1$, and $R_2$ has a second FSR, $FSR_2$. Both $FSR_1$ and $FSR_2$ are less than 10 nm and are limited by a tuning efficiency. The tuning efficiency is typically less than 0.1 nm/degree Celsius (° C.) because the length of the first CR 150 or the second CR 160 is less than or equal to the single-path delay of the laser 100. As can be seen, $FSR_1$ and $FSR_2$ are similar, which enhances $\Delta f_1$, the tuning range of $R_{combined}$. $\Delta f_1$ is calculated as follows:

$$\Delta f_1 = \frac{FSR_1 \times FSR_2}{FSR_1 - FSR_2}. \tag{1}$$

The Vernier effect between the first CR 150 and the second CR 160 is used to tune $\Delta f_1$. However, as the first CR 150 and the second CR 160 age, $R_1$ and $R_2$ may shift, thus causing $R_{combined}$ to also shift. Even a relatively small shift in either $R_1$ or $R_2$ may significantly shift $R_{combined}$. In other words, combining the reflectivity of the first CR 150 and the second CR 160 amplifies the age-related shift of the first CR 150 and the second CR 160. Such a significant age-related shift is undesirable.

Disclosed herein are embodiments for improved tunable lasers. The lasers do not use the Vernier effect between two CRs, which provides for multiple reflectivity peaks in a desired wavelength range. Instead, the lasers comprise a bandpass filter and a CR to tune reflectivity, and thus wavelength, across the full C band, which provides a single reflectivity peak in the desired wavelength range. That single peak, in turn, improves reliability by reducing the effect of the age-related shift described above. In addition, the lasers are hybrid integrated lasers, meaning that they comprise different materials, namely an InP gain medium and a silicon (Si) waveguide. Moreover, the lasers employ additional techniques to improve light coupling from the InP gain medium to the Si waveguide, decrease the power loss by reducing the two-photon absorption in the Si waveguide, achieve high thermal wavelength tuning efficiency by using a suspended structure for the silicon waveguide, flexibly control the bandpass filter, and improve thermal stability by employing flip chip bonding of a control circuit to the silicon waveguide circuits.

Figure 3:
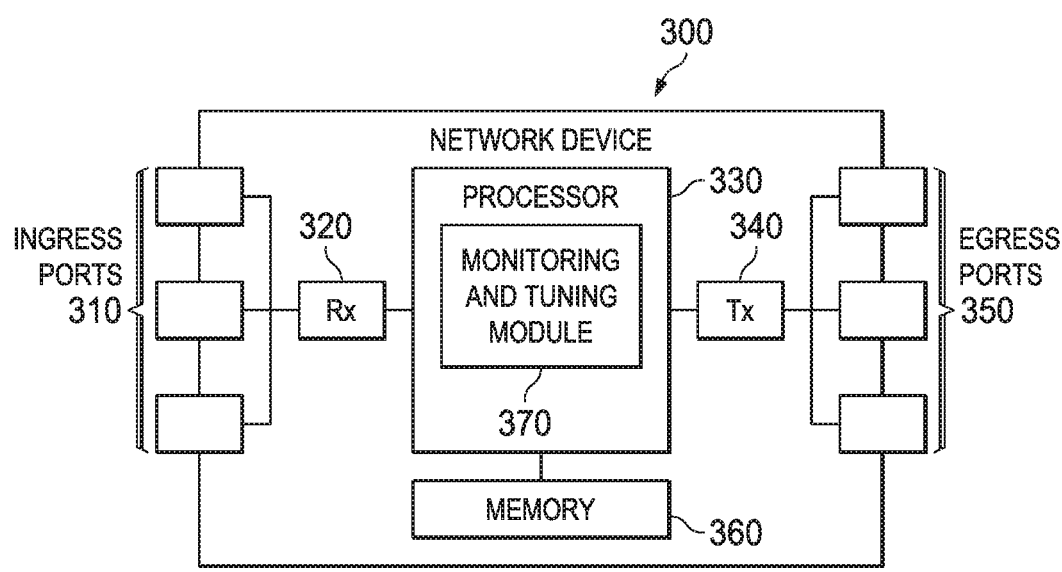
FIG. 3 is a schematic diagram of a network device according to an embodiment of the disclosure.

FIG. 3 is a schematic diagram of a network device 300 according to an embodiment of the disclosure. The device 300 is suitable for implementing the disclosed embodiments as described below. The network device 300 comprises ingress ports 310 and receiver units (Rx) 320 for receiving data; a processor, logic unit, or central processing unit (CPU) 330 to process the data; transmitter units (Tx) 340 and egress ports 350 for transmitting the data; and a memory 360 for storing the data. The network device 300 may also comprise optical-to-electrical (OE) components and electrical-to-optical (EO) components coupled to the ingress ports 310, the receiver units 320, the transmitter units 340, and the egress ports 350 for egress or ingress of optical or electrical signals.

The processor 330 is implemented by hardware and software. The processor 330 may be implemented as one or more CPU chips, cores (e.g., as a multi-core processor), field-programmable gate arrays (FPGAs), application specific integrated circuits (ASICs), and digital signal processors (DSPs). The processor 330 is in communication with the ingress ports 310, receiver units 320, transmitter units 340, egress ports 350, and memory 360. The processor 330 comprises a monitoring and tuning module 370. The module 370 assists in implementing the disclosed embodiments as described below. The inclusion of the module 370 therefore provides a substantial improvement to the functionality of the device 300 and effects a transformation of the device 300 to a different state. Alternatively, the module 370 is implemented as instructions stored in the memory 360 and executed by the processor 330.

The memory 360 comprises one or more disks, tape drives, and solid-state drives and may be used as an overflow data storage device, to store programs when such programs are selected for execution, and to store instructions and data that are read during program execution. The memory 360 may be volatile and non-volatile and may be read-only memory (ROM), random-access memory (RAM), ternary content-addressable memory (TCAM), and static random-access memory (SRAM).

Figure 4:
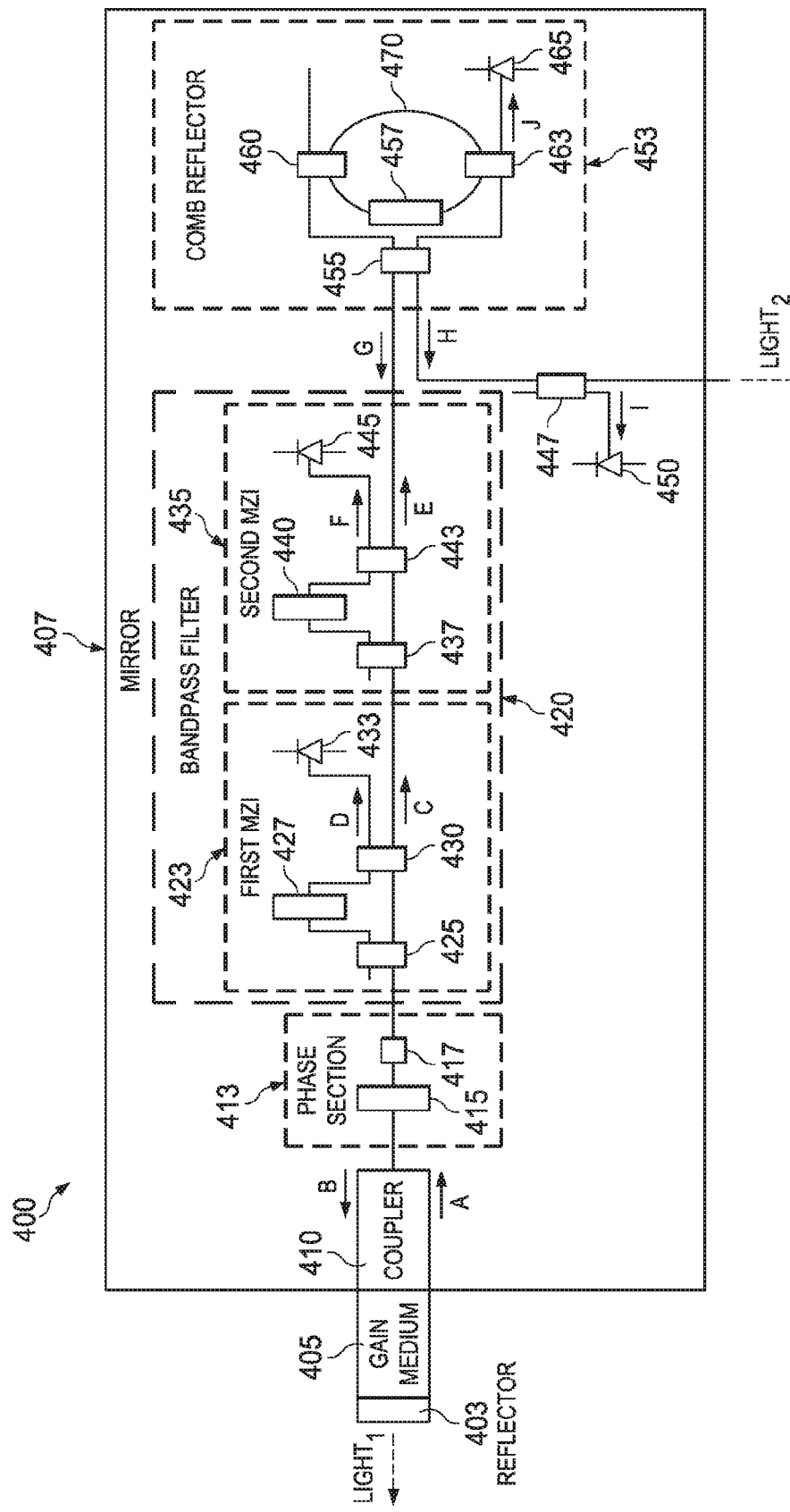
FIG. 4 is a schematic diagram of a tunable laser according to an embodiment of the disclosure.

FIG. 4 is a schematic diagram of a tunable laser 400 according to an embodiment of the disclosure. The laser 400 may be used in a transmitter. In addition, for applications such as coherent communications, the laser 400 may be used in a receiver as a local oscillator in order to lock the receiver onto the wavelength of a corresponding transmitter. The laser 400 comprises a reflector 403, a gain medium 405, and a mirror 407. The components of the laser 400 may be arranged as shown or in any other suitable manner. The reflector 403, the gain medium 405, and the mirror 407 form a cavity. The laser 400 lases and emits light either out of the reflector 403 and to the left of the page as light$_1$ or out of the mirror 407 and to the bottom of the page as light$_2$. The device 300 may be coupled to the laser 400 at various points in order to monitor and tune the laser 400. The device 300 and the laser 400 may be an integrated apparatus or separate components.

The reflector 403 is a broadband reflector. In this context, broadband means that most or all wavelengths have the same reflectivity. The reflector 403 may be a separate component or may be achieved by thin-film coating the left facet of the gain medium 405. The reflector 403 has a reflectivity $R_R$. When a light travels from the gain medium 405 to the reflector 403, depending on $R_R$, the reflector 403 reflects a first portion of the light back to the gain medium 405 and allows a second portion of the light to pass through as light$_1$.

The gain medium 405 comprises InP. Alternatively, the gain medium 405 comprises another material suitable for optical gain. The gain medium 405 is excited via a pump source and provides optical gain, or amplification of the optical power of light, in the laser 400. The gain medium 405 is butt coupled or bonded to a chip comprising the mirror 407.

The mirror 407 comprises a coupler 410, a phase section 413, a bandpass filter 420, a power splitter 447, a photodiode (PD) 450, a CR 453, and a waveguide 470. The coupler 410 couples light between the gain medium 405 and the waveguide 470. The coupler 410 does so using evanescent coupling as described further below or using another suitable means.

The phase section 413 comprises a local heater 415 and a p-n junction 417. Thermal tuning with the local heater 415 provides higher-efficiency, slower tuning. Specifically, for a 100 micrometers (μm) waveguide, a 30° C. change may effect a π phase shift at 1,550 nm. That temperature change has a power consumption of about 30 milliwatts (mW) for the structure 1100 and a power consumption of about 3 mW for the structure 1200. However, thermal tuning with the local heater 415 takes microseconds to complete. Carrier depletion tuning of the p-n junction 417 provides lower-efficiency, faster tuning. Specifically, for a 100 μm p-n junction, an applied voltage of 2 volts (V) may effect a 0.01π phase shift. However, the voltage application and thus the carrier depletion tuning take picoseconds to complete. Current injection tuning of the p-n junction 417 provides moderate-efficiency, moderate-speed tuning. Thus, thermal tuning with the local heater 415 is suited for reducing wavelength drifting over a long period of time, while carrier depletion tuning of the p-n junction 417 is suited for maintaining a wavelength over a short period of time. The p-n junction 417 comprises silicon.

The bandpass filter 420 comprises a first Mach-Zehnder interferometer (MZI) 423 and a second MZI 435. The first MZI 423 comprises a first power splitter 425, a local heater 427, a second power splitter 430, and a PD 433. The first MZI 423 has a transmittance $T_{MZI1}$ and has an FSR of about two to about six times $FSR_{CR}$, an FSR of the CR 453. The first power splitter 425, the second power splitter 430, and the other splitters in the laser 400 function as splitters, but may also function and be referred to as combiners. The second MZI 435 comprises a first power splitter 437, a local heater 440, a second power splitter 443, and a PD 445. The second MZI 435 has an FSR of about two to about six times the FSR of the first MZI 423 and a transmittance $T_{MZI2}$. $T_{BF}$, the transmittance of the bandpass filter 420, is therefore expressed as follows:

$$T_{BF} = T_{MZI1} \times T_{MZI2}. \qquad (1)$$

The first MZI 423 may achieve full C-band tunability when the length of the bandpass filter 420 is M times the delay line length between the two arms of the first MZI 423. M is a positive integer. This relationship enhances the tuning range $\Delta f_2$ of the first MZI 423 by M. As a first design example, for $\Delta f_2$ to be 40 nm when the phase shift of the first MZI 423 is 3.5π, the delay line length of the first MZI 423 is 28 μm, the waveguide 470 within the first MZI 423 is silicon, and the change of the refractive index of the first MZI 423 is 2.5e$^{-4}$/° C. for silicon, a temperature change of 388° C. is needed. That temperature change may be difficult to achieve for the first MZI 423. As a second design example, when the delay line length of the first MZI 423 is 180 μm, a temperature change of 60° C. is needed. That temperature change may be much easier to achieve for the first MZI 423. The same principles hold true for the second MZI 435 as well.

The PDs 433, 445, 450, 465 are integrated with the waveguide 470 and comprise germanium (Ge). Alternatively, the PDs 433, 445, 450, 465 comprise another suitable material. The PD 433 is coupled to a bar port of the first MZI 423, the PD 445 is coupled to a bar port of the second MZI 435, the PD 450 is coupled to an output port of the power splitter 447, and the PD 465 is coupled to a bar port of the CR 453. The PD 433 measures $current_D$, the photocurrent of light D; the PD 445 measures $current_F$, the photocurrent of light F; the PD 450 measures $current_I$, the photocurrent of light I; and the PD 465 measures $current_J$, the photocurrent of light J. The device 300 may use the PDs 433, 445, 450, 465 to tune, particularly fine tune, the bandpass filter 420 and the CR 453.

The CR 453 comprises a first power splitter 455, a local heater 457, a second power splitter 460, a third power splitter 463, and a PD 465. The components of the CR 453 form a ring resonator within a waveguide loop mirror. The first power splitter 455 receives an input light from the bandpass filter 420, splits the input light into two lights, and guides those lights into separate waveguides that loop back to each other through the ring resonator. The FSR of the CR 453 is $FSR_{CR}$, which is expressed as follows:

$$FSR_{CR} = C_{CR}(RI_{CR}), \quad (2)$$

where $C_{CR}$ is the circumference of the ring in the ring resonator and $RI_{CR}$ is the refractive index of the CR 453. $FSR_{CR}$ is about 4 nm to about 10 nm. The first power splitter 455, the second power splitter 460, and the third power splitter 463 may be 1×2 multimode interference (MMI) couplers, 2×2 MMIs, or directional couplers such as wideband directional couplers. In this context, wideband means that coupling is not wavelength dependent or is minimally wavelength dependent. It may be preferred that the first power splitter 455, the second power splitter 460, and the third power splitter 463 are wideband directional couplers. The first power splitter 455 has a splitting ratio S, the light A has a radiant power of $P_A$, the light B has a radiant power of $P_B$, and the CR 453 has a reflectivity of $R_{CR}$. $R_{CR}$ is expressed as follows:

$$R_{CR} = \frac{P_B}{P_A} \quad (3)$$

$$R_{CR} \propto \frac{4S}{(1+S)^2}. \quad (4)$$

The light C has a radiant power of $P_C$, and the mirror 407 has a transmittance of $T_{mirror}$. $T_{mirror}$ is expressed as follows:

$$T_{mirror} = \frac{P_C}{P_A} \quad (5)$$

$$T_{mirror} \propto \frac{(1-S)^2}{(1+S)^2}. \quad (6)$$

$R_M$, the reflectivity of the mirror 407, is expressed as follows:

$$R_M = T_{BF}^2 R_{CR}. \quad (7)$$

Alternatively, the CR 353 is a DBR.

The waveguide 470 comprises Si, InP, silicon dioxide ($SiO_2$), silicon nitride (SiN), or another suitable material. To make the mirror 407 compact, the bending radius of the waveguide 470 should be in the range of about 5 μm to about 100 μm. The process to make such a small bending radius in InP is very complex because InP foundry tools are typically not advanced. In addition, $SiO_2$ and SiN have a wavelength thermal tuning efficiency one order of magnitude lower than Si and InP. Thus, the waveguide 470 is preferably Si. While the waveguide 470 is shown on the right side of the laser 400, the lines coupling the components throughout the laser 400 are also the waveguide 470. The segments of the waveguide 470 shown individually between the components may be referred to as separate waveguides. Two components, for instance the phase section 413 and the bandpass filter 420, may be considered to be coupled to each other via the waveguide 470.

The laser emits either $light_1$ or $light_2$. To emit $light_1$, the laser 400 is designed so that $R_R$ is low, S is 1, and $R_{CR}$ is 100%. To emit $light_2$, the laser 400 is designed so that $R_R$ is high and S is not equal to 1.

The device 300 performs both coarse tuning and fine tuning of the laser 400. The device 300 performs coarse tuning based on, for instance, a lookup table. The device 300 may generate the lookup table and coarse tune the laser 400 during calibration of the laser 400, meaning before regular data communication begins, or during another suitable time. The device 300 tunes the bandpass filter 420 so that a wavelength corresponding to $T_{BF,peak}$, a peak of $T_{BF}$, is the same as the target wavelength. The device 300 tunes the CR 453 so that a wavelength corresponding to $R_{CR,peak}$, a peak of $R_{CR}$, is the same as the target wavelength. The device 300 performs that tuning by thermal tuning of the local heaters 427, 440, 457 based on the lookup table.

The device 300 performs fine tuning in order to offset wavelength shifting of the first MZI 423, the second MZI 435, or the CR 453 due to aging. The device 300 may fine tune the laser 400 after regular data communication begins and during set time intervals, based on a monitoring scheme that detects when fine tuning is needed, or during another suitable time. When either a wavelength corresponding to a transmittance peak of the bandpass filter 420 or a wavelength corresponding to a reflectivity peak of the CR 453 is the same as a lasing wavelength of the laser 400, the ratios $current_D/current_I$, $current_F/current_I$, and $current_J/current_I$ are at their minima and the device 300 does not need to tune the laser 400. When either the wavelength corresponding to the transmittance peak of the bandpass filter 420 or the wavelength corresponding to the reflectivity peak of the CR 453 is not the same as a target lasing wavelength of the laser 400, the device 300 may tune the laser 400 to the target lasing wavelength first by tuning the phase section 413 and second by minimizing the ratio $current_D/current_I$. The device 300 tunes the phase section 413 so that the round-trip optical path length ($OPL_{RT}$) of the cavity in the mirror 407 has the following relationship:

$$OPL_{RT} = N(\lambda_{target}), \quad (8)$$

where N is a positive integer and $\lambda_{target}$ is the target wavelength. The optical path length (OPL) is expressed as follows:

$$OPL = L(RI_{PS}) \quad (9)$$

where L is the physical, geometric length of the path light follows from the reflector 403 to the CR 453 and $RI_{PS}$ is the index of refraction of the phase section 413. $OPL_{RT}$ and OPL are related as follows:

$$OPL_{RT} = 2(OPL). \tag{10}$$

Equations 8-10 therefore provide:

$$2(L)(RI_{PS}) = N(\lambda_{target}). \tag{11}$$

L cannot be changed after fabrication of the laser 400. However, RI may be changed. Thus, solving for $RI_{PS}$ provides:

$$RI_{PS} = \frac{N(\lambda_{target})}{2L}. \tag{12}$$

The device 300 therefore tunes the phase section 413 by adjusting $RI_{PS}$ to satisfy equation 12. The device 300 does so by thermal tuning of the local heater 415, carrier depletion tuning of the p-n junction 417, current injection tuning of the p-n junction 417, or combinations thereof. The device 300 minimizes the ratio $current_D/current_I$ by determining the ratio $current_D/current_I$ via the PDs 433, 450 and thermal tuning of the local heaters 427, 440 for the bandpass filter 420 and thermal tuning of the local heater 457 for the CR 453.

Figure 5A:
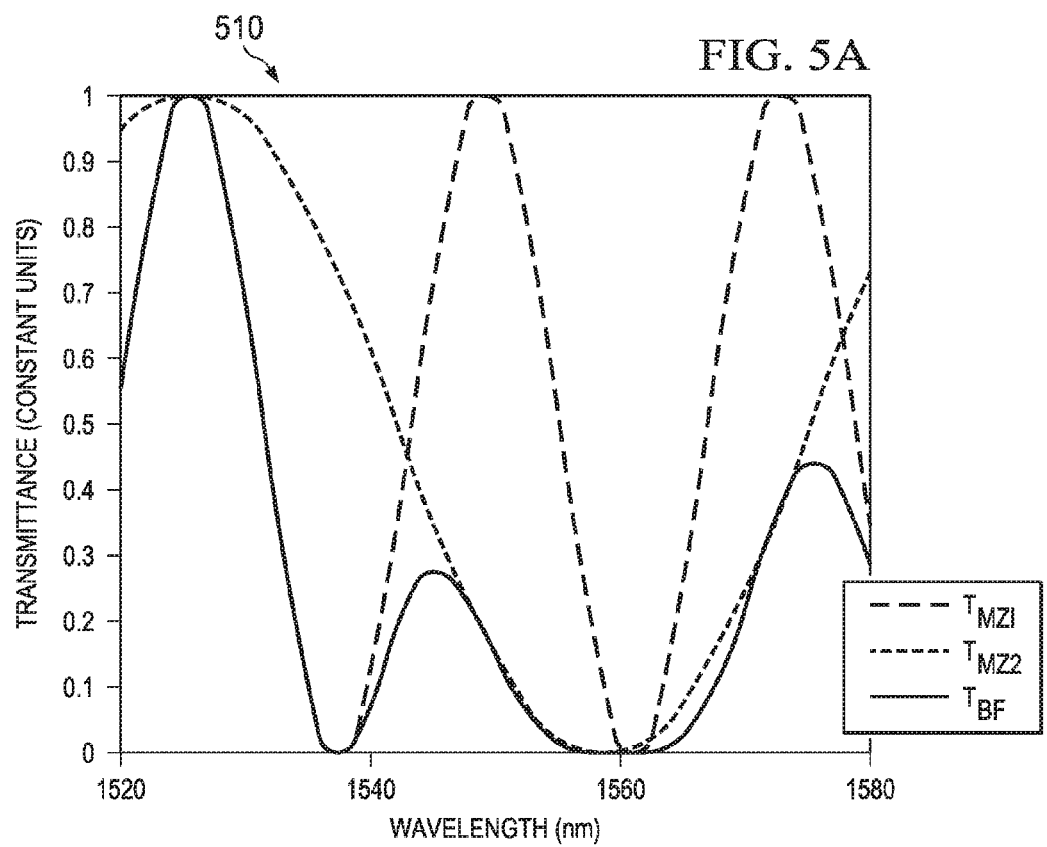
FIG. 5A is a graph of simulated transmittance of the first MZI, the second MZI, and the bandpass filter in FIG. 4.
Figure 6A:
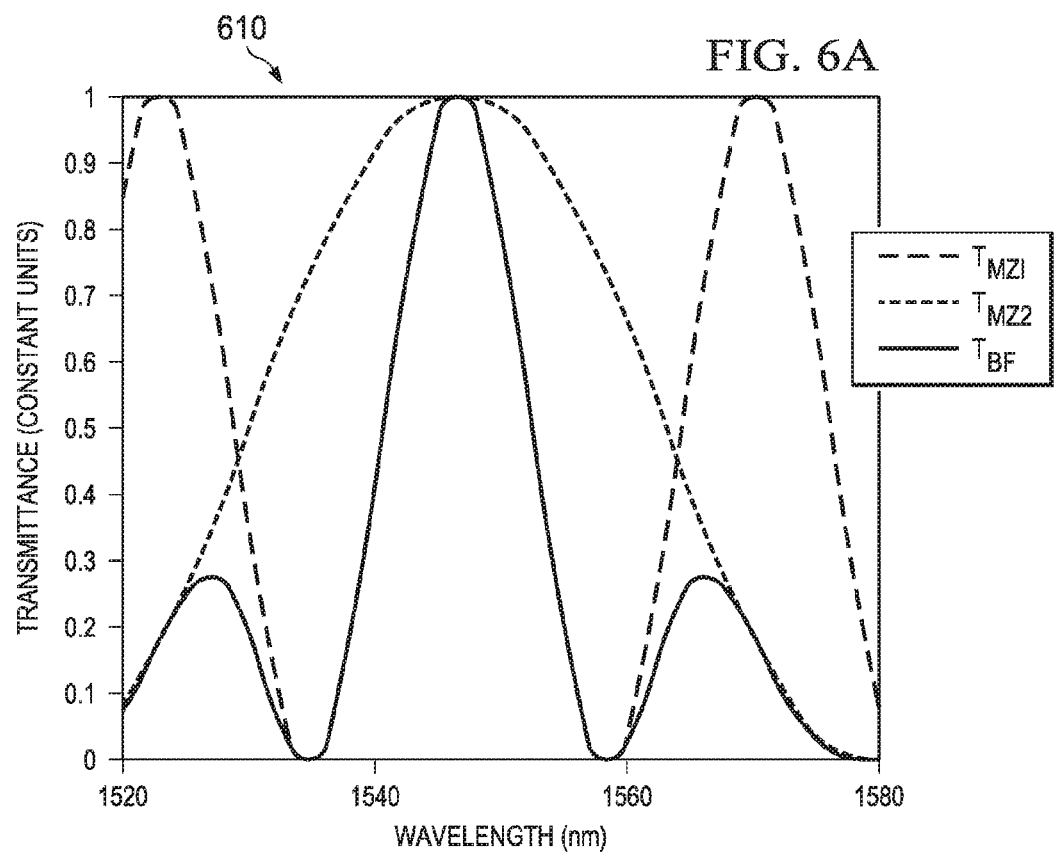
FIG. 6A is another graph of simulated transmittance of the first MZI, the second MZI, and the bandpass filter in FIG. 4.
Figure 6B:
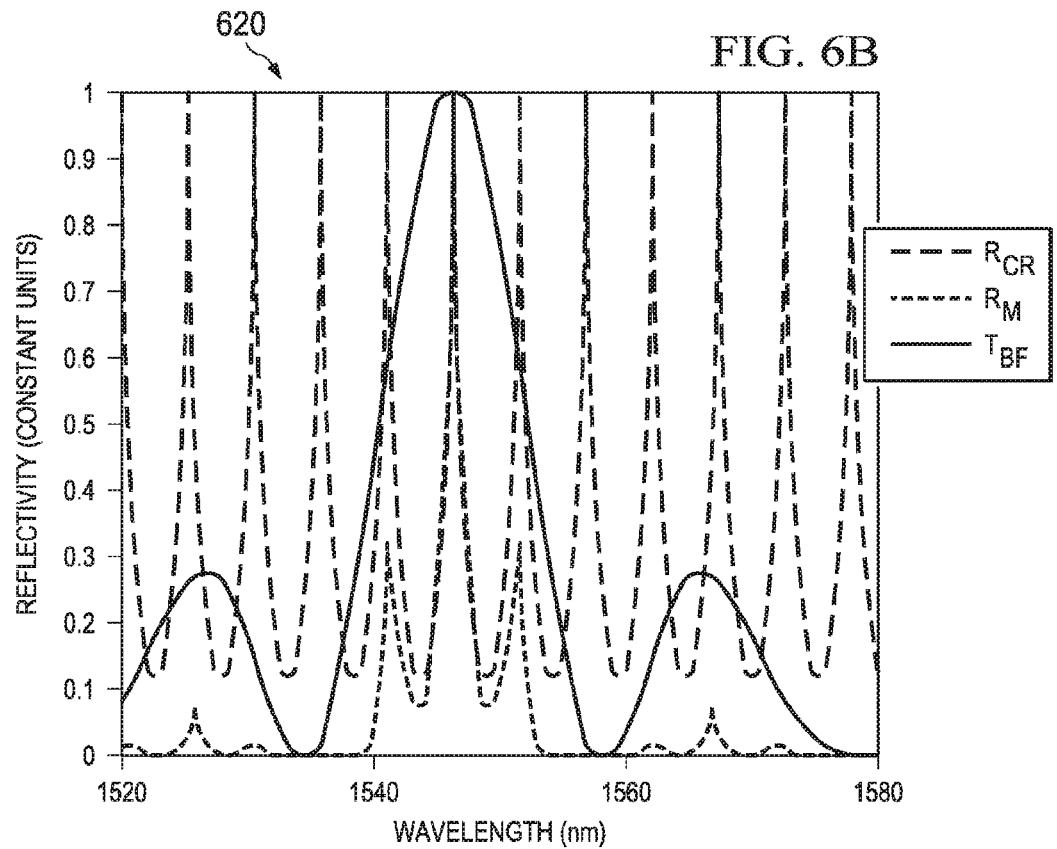
FIG. 6B is another graph of simulated reflectivity of the bandpass filter, the CR, and the mirror in FIG. 4.
Figure 7A:
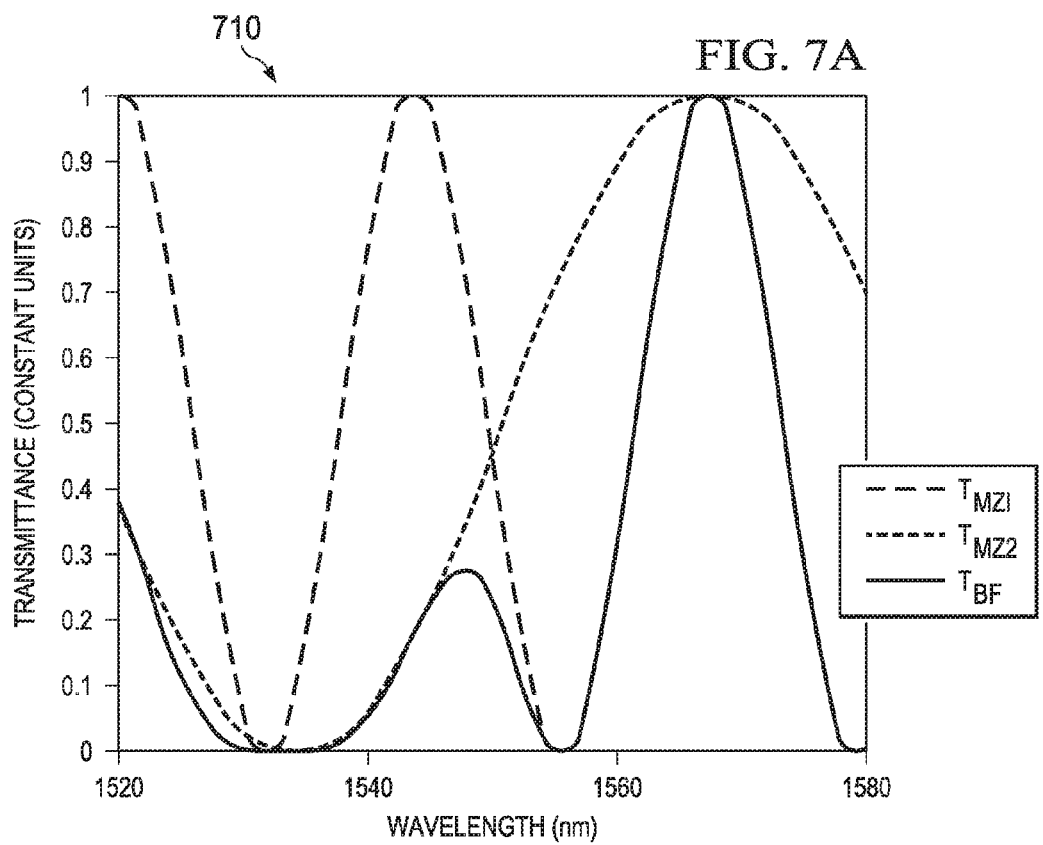
FIG. 7A is yet another graph of simulated transmittance of the first MZI, the second MZI, and the bandpass filter in FIG. 4.
Figure 7B:
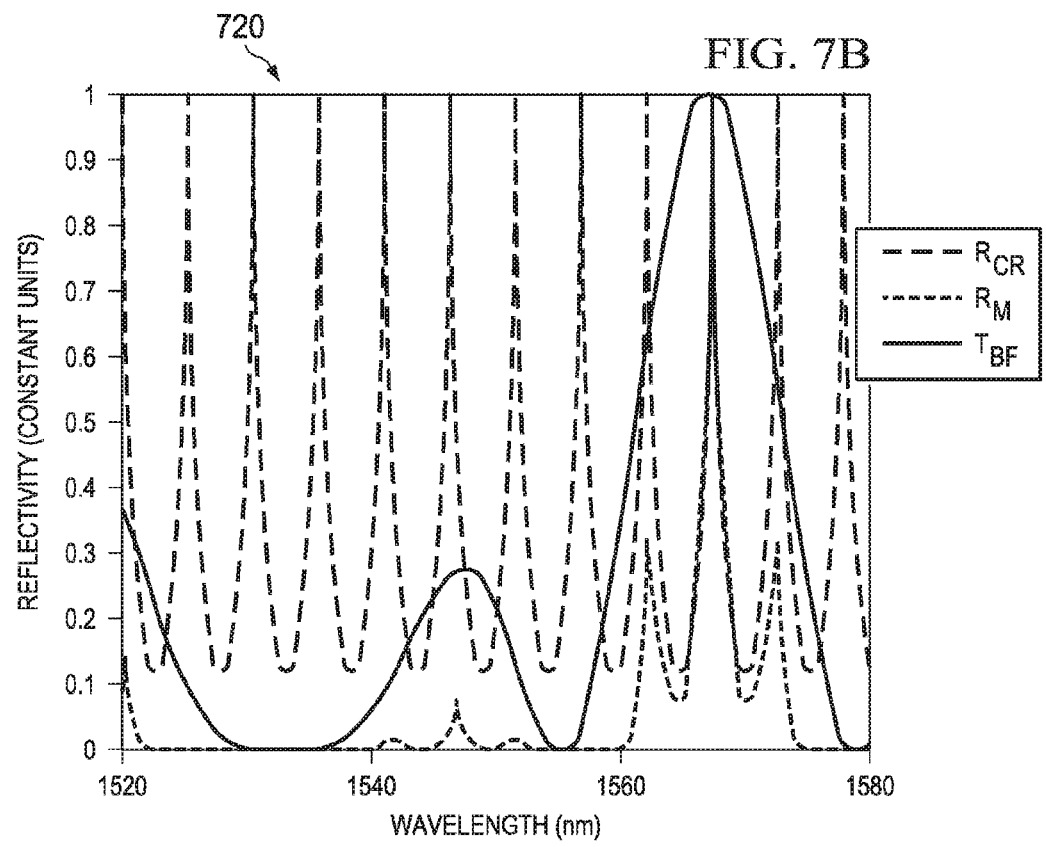
FIG. 7B is yet another graph of simulated reflectivity of the bandpass filter, the CR, and the mirror in FIG. 4.

FIGS. 5A-7B show various simulated transmittance spectra and reflectivity spectra for the first MZI 423, the second MZI 435, and the CR 453. FIGS. 5-7 assume various parameters. Specifically, the FSR of the first MZI 423 is 23.6 nm, and the delay of the first MZI 423 is 28 μm. The FSR of the second MZI 435 is 66.2 nm, and the delay of the second MZI 435 is 10 μm. $FSR_{CR}$ 453 is 5 nm, and $C_{CR}$ is 128 μm.

Figure 5B:
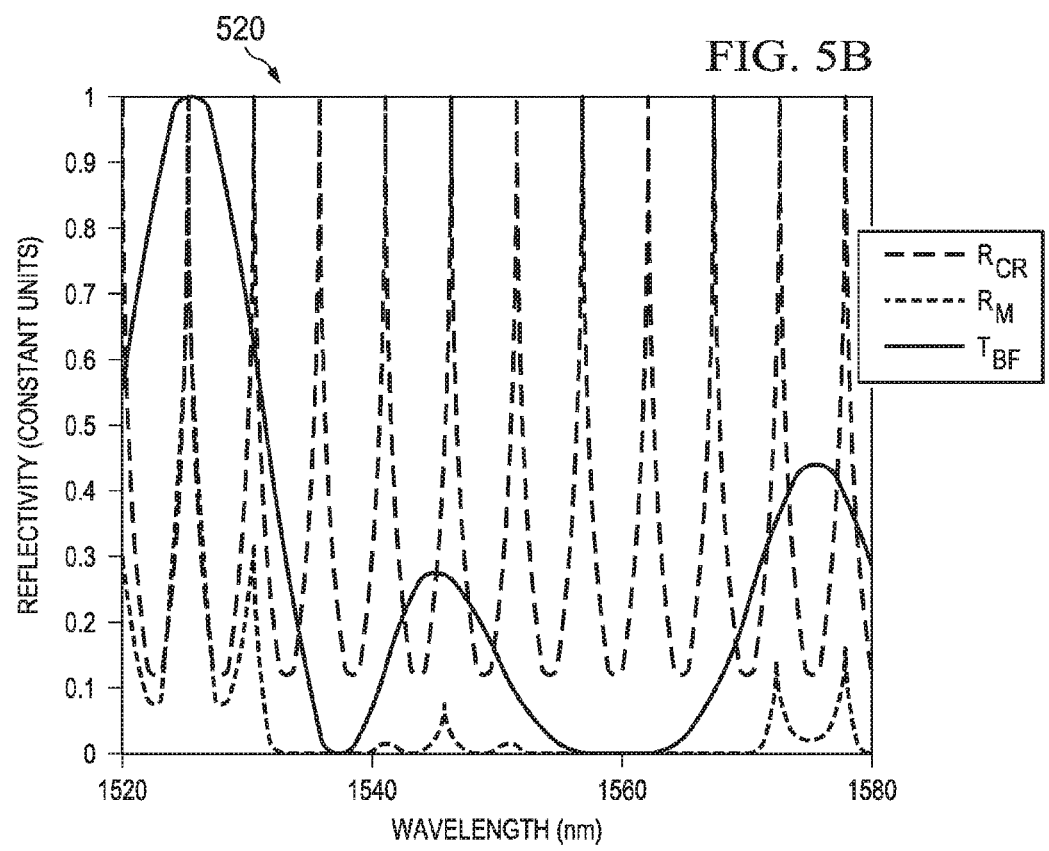
FIG. 5B is a graph of simulated reflectivity of the bandpass filter, the CR, and the mirror in FIG. 4.

FIG. 5A is a graph 510 of simulated transmittance of the first MZI 423, the second MZI 435, and the bandpass filter 420 in FIG. 4. The x-axis represents wavelength in units of nanometers, and the y-axis represents transmittance in constant units. FIG. 5B is a graph 520 of simulated reflectivity of the bandpass filter 420, the CR 453, and the mirror 407 in FIG. 4. The x-axis represents wavelength in units of nanometers, and the y-axis represents reflectivity in constant units. Both FIG. 5A and FIG. 5B assume that the first MZI 423 has no phase tuning, the second MZI 435 has no phase tuning, and the bandpass filter 420 has a highest transmittance peak, or main transmittance peak, of 1,525.44 nm.

FIG. 6A is a graph 610 of simulated transmittance of the first MZI 423, the second MZI 435, and the bandpass filter 420 in FIG. 4. The x-axis represents wavelength in units of nanometers, and the y-axis represents transmittance in constant units. FIG. 6B is a graph 620 of simulated reflectivity of the bandpass filter 420, the CR 453, and the mirror 407 in FIG. 4. The x-axis represents wavelength in units of nanometers, and the y-axis represents reflectivity in constant units. Both FIG. 6A and FIG. 6B assume that the first MZI 423 has phase tuning of 1.8π, the second MZI 435 has phase tuning of 0.6π, and the bandpass filter 420 has a main transmittance peak of 1,545.96 nm.

FIG. 7A is a graph 710 of simulated transmittance of the first MZI 423, the second MZI 435, and the bandpass filter 420 in FIG. 4. The x-axis represents wavelength in units of nanometers, and the y-axis represents transmittance in constant units. FIG. 7B is a graph 720 of simulated reflectivity of the bandpass filter 420, the CR 453, and the mirror 407 in FIG. 4. The x-axis represents wavelength in units of nanometers, and the y-axis represents reflectivity in constant units. Both FIG. 7A and FIG. 7B assume that the first MZI 423 has phase tuning of 3.5π, the second MZI 435 has phase tuning of 1.3π, and the bandpass filter 420 has a main transmittance peak of 1,567 nm.

As can be seen from FIGS. 5A-7B, adjusting the phase tuning of the first MZI 423 and the second MZI 435 affects both the main transmittance peak of the bandpass filter 420 and the main reflectivity peak of the mirror 407. Specifically, increasing the phase tuning of the first MZI 423 and the second MZI 435 shifts the main transmittance peak of the bandpass filter 420 to a higher wavelength. That shift in the main transmittance peak of the bandpass filter 420, in turn, shifts the main reflectivity peak of the mirror 407 to a higher wavelength.

Figure 8:
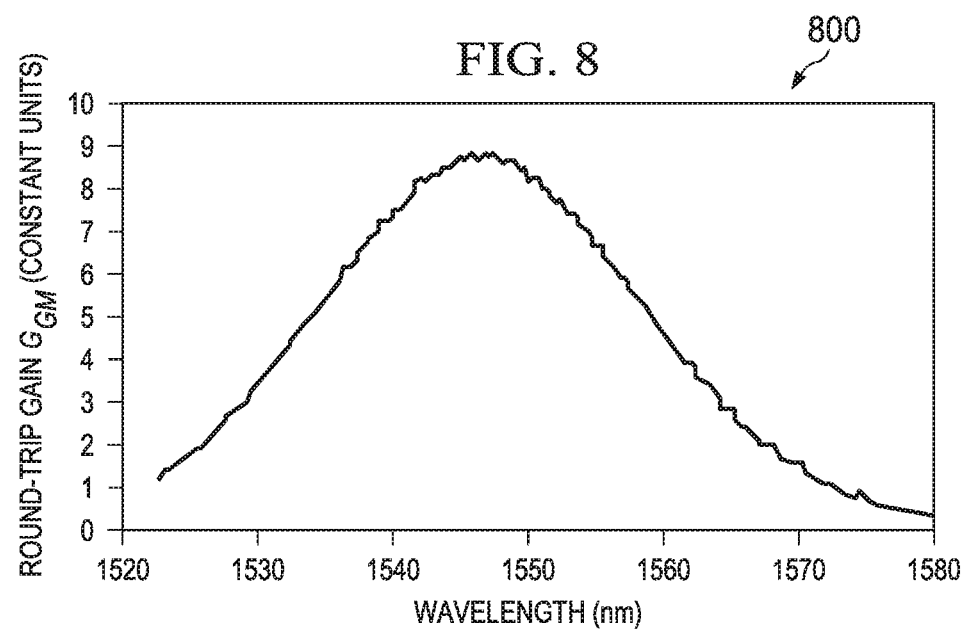
FIG. 8 is a graph of round-trip gain of the gain medium in FIG. 4.

FIG. 8 is a graph 800 of round-trip gain of the gain medium 405 in FIG. 4. The x-axis represents wavelength in nanometers, and the y-axis represents the round-trip gain $G_{GM}$ of the gain medium 405 in constant units. The gain medium 405 exhibits a value of about 3 at 1,528 nm, the start of the C band. The gain medium 405 exhibits a value of about 9 at its peak round-trip gain, which is at about 1,547 nm. Thus, the gain medium 405 exhibits a C-band round-trip gain ratio of about 9 to 3, or about 3.

Returning to FIG. 7B, the reflectivity of the mirror 407 has a main reflectivity peak at about 1,568 nm. However, the reflectivity of the mirror 407 also has a secondary reflectivity peak at about 1,562 nm and a tertiary reflectivity peak at about 1,546 nm. FIGS. 5B and 6B exhibit similar peaks. In this context, a suppression ratio refers to the ratio between the reflectivity value of a first reflectivity peak to the reflectivity value of a second reflectivity peak. The mirror 407 may achieve full C-band tunability when the suppression ratio of the main reflectivity peak to the secondary reflectivity peak is at least about 3 and when the suppression ratio of the main reflectivity peak to the tertiary reflectivity peak is at least about 10. Such suppression ratios ensure that the laser 400 lases at the main reflectivity peak of the mirror 407 when the gain medium 405 has a round-trip gain similar to that shown in the graph 800. Finally, the laser 400 has a lasing wavelength of $\lambda_{lase}$, which is expressed as follows:

$$\lambda_{lase} = (R_M G_{GM})_{peak}. \tag{13}$$

As shown in equation 13, $\lambda_{lase}$ is the wavelength corresponding to a peak of the product of $R_M$, which is shown in FIG. 7B, and $G_{GM}$, which is shown in FIG. 8.

Figure 9:
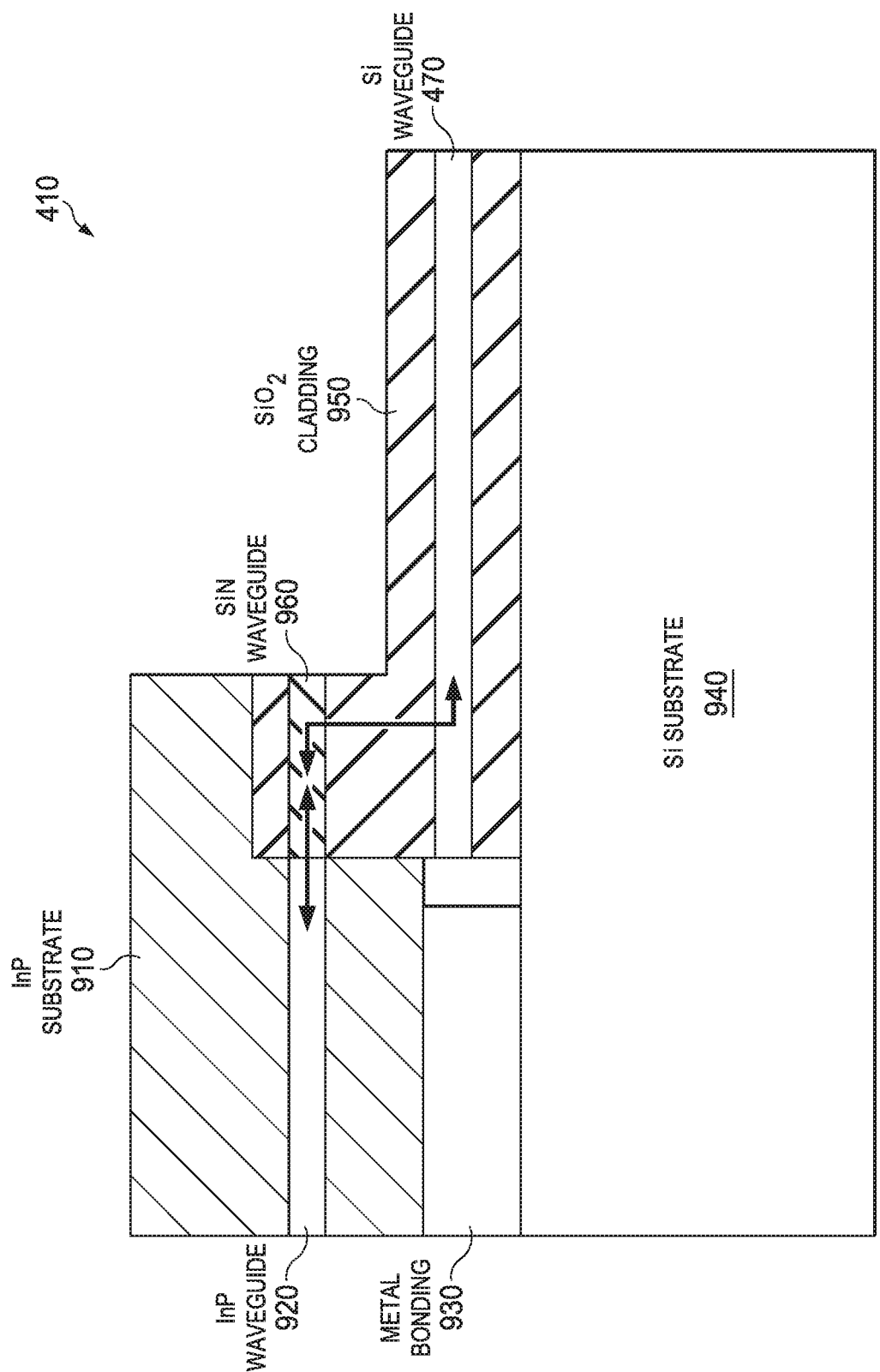
FIG. 9 is a schematic diagram of a side cross-sectional view of the coupler in FIG. 4.

FIG. 9 is a schematic diagram of a side cross-sectional view of the coupler 410 in FIG. 4. The coupler 410 comprises an InP substrate 910, an InP waveguide 920, a metal bonding 930, an Si substrate 940, an $SiO_2$ cladding 950, an SiN waveguide 960, and an Si waveguide 470. The coupler 410 employs evanescent coupling as shown. Evanescent coupling provides a large alignment tolerance between the gain medium 405 and the Si waveguide 470, which allows for passive alignment. However, the coupler 410 may also employ butt coupling or bonding.

During fabrication, the InP waveguide 920 is fabricated on the InP substrate 910. The gain medium 405 is flip chip bonded to an Si chip that comprises the mirror 407. During operation, light travels as shown by the arrows. Specifically, a light from the InP waveguide 920 butt couples to the SiN waveguide 960. The light then evanescently couples from the SiN waveguide 960 to the Si waveguide 470.

Figure 10:
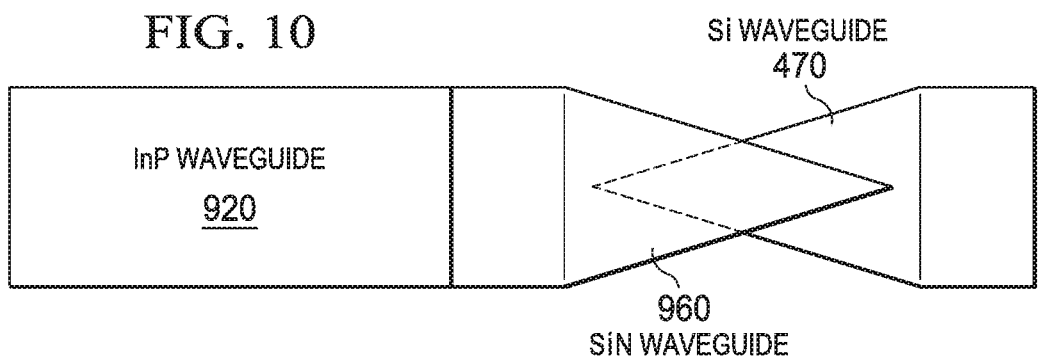
FIG. 10 is a schematic diagram of a top view of the coupler in FIG. 4.

FIG. 10 is a schematic diagram of a top view of the coupler 410 in FIG. 4. In FIG. 10, the InP waveguide 920, the SiN waveguide 960, and the Si waveguide 470 of the coupler 410 are shown. As can be seen, the width of the SiN waveguide 960 decreases and tapers down to a tip towards the Si waveguide 470. As the width of the SiN waveguide 960 decreases, the refractive index of the SiN waveguide 960 also decreases. Meanwhile, the width of the Si waveguide 470 increases and tapers up from a tip away from the SiN waveguide 960. As the width of the Si waveguide 470 increases, the refractive index of the Si waveguide 470 also increases. At a point in the coupler 410 where the refractive index of the Si waveguide 470 surpasses the refractive index of the SiN waveguide 960, light couples from the SiN waveguide 960 to the Si waveguide 470.

The width of the SiN waveguide 960 at its maximum may be up to about 2 μm as limited by current fabrication processes. When the thickness of the Si waveguide 470 is about 220 nm, the width of the Si waveguide 470 at its maximum may be up to about 500 nm as limited by current fabrication processes. The widths of the tips for both the SiN waveguide 960 and the Si waveguide 470 are also limited by current fabrication processes and determine the coupling loss between the SiN waveguide 960 and the Si waveguide 470.

Figure 11:
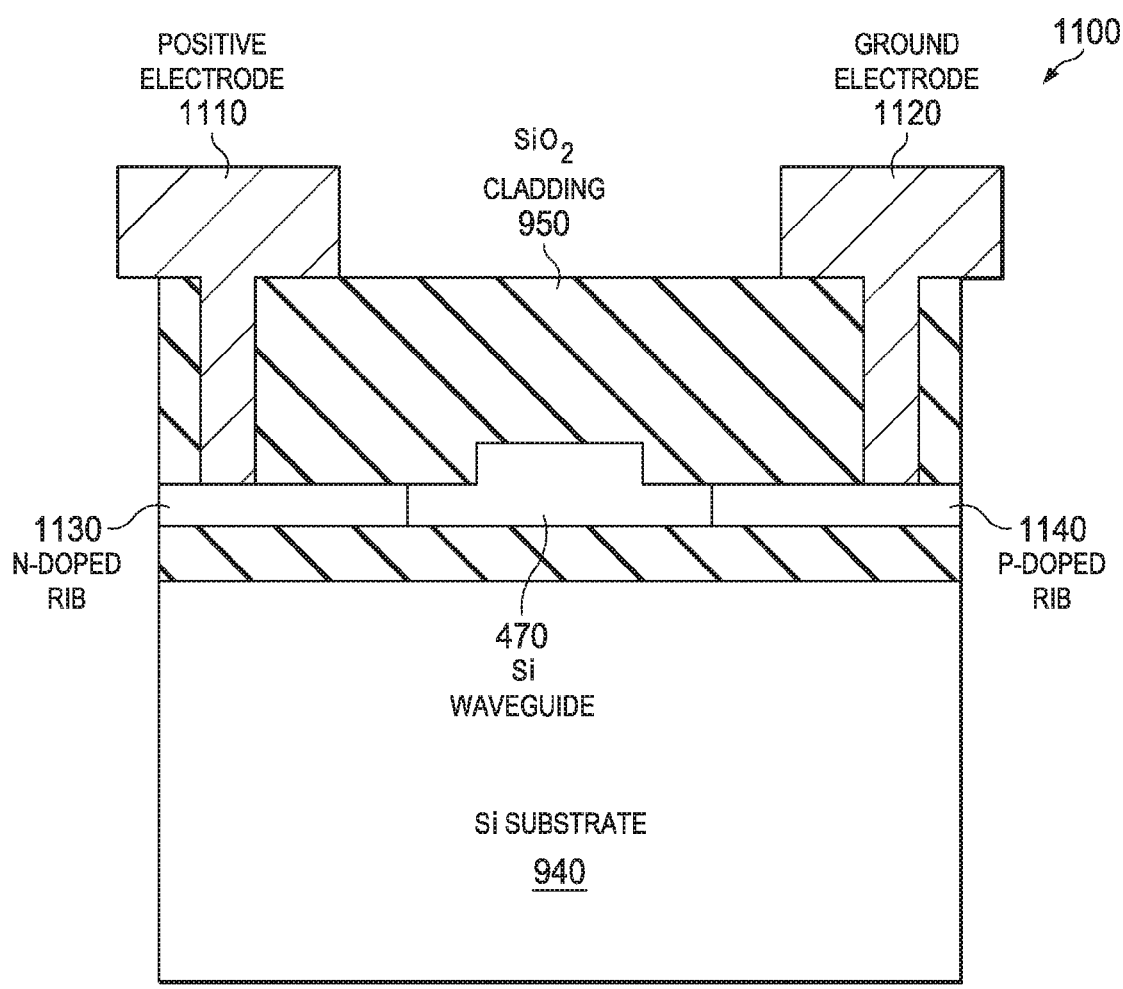
FIG. 11 is a schematic diagram of a front view of a structure for the waveguide in FIG. 4.

FIG. 11 is a schematic diagram of a front view of a structure 1100 for the waveguide 470 in FIG. 4. The structure 1100 comprises the Si waveguide 470, the Si substrate 940, and the SiO$_2$ cladding 950, but also a positive electrode 1110, a ground electrode 1120, an n-doped rib 1130, and a p-doped rib 1140. To reduce the loss introduced by the two-photon absorption effect in the waveguide 470 at high optical power, a rib waveguide comprising the n-doped rib 1130 and the p-doped rib 1140 is used. Specifically, the n-doped rib 1130, the waveguide 470, and the p-doped rib 1140 form a PIN diode. The positive electrode 1110 couples to the n-doped rib 1130 and the ground electrode 1120 couples to the p-doped rib 1140 to provide a reverse bias, which removes free carriers generated by the two-photon absorption effect.

Figure 12:
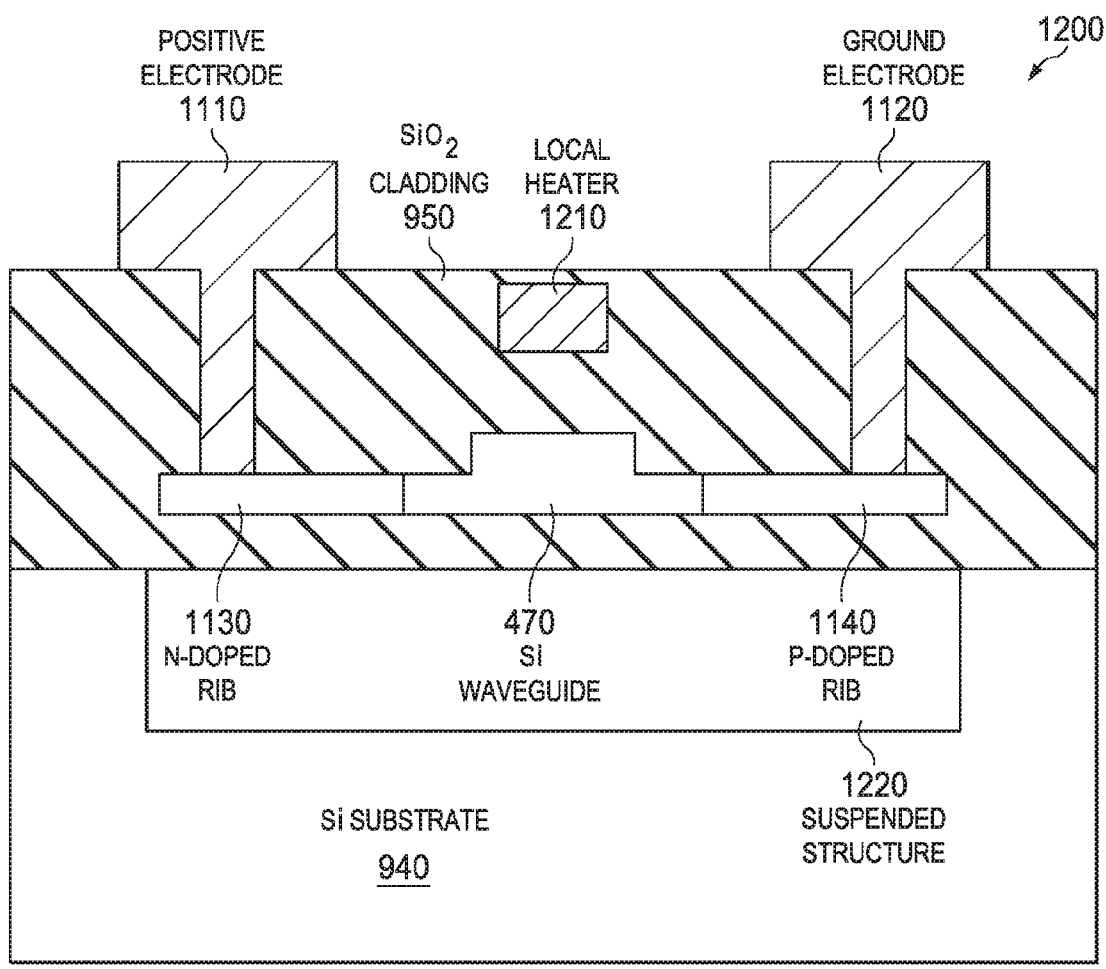
FIG. 12 is a schematic diagram of a front view of another structure for the waveguide in FIG. 4.

FIG. 12 is a schematic diagram of a front view of another structure 1200 for the waveguide 470 in FIG. 4. The structure 1200 is similar to the structure 1100, but also comprises a local heater 1210 and a suspended structure 1220. The suspended structure 1220 comprises air. One important metric for the laser 400 is its power consumption, including its power consumption due to wavelength tuning, which is based on thermal tuning. In the structure 1200, the suspended structure 1220 reduces the power consumption from thermal tuning of the local heater 1210 by at least one order of magnitude. This is because the local heater 1210 is thermally coupled to the suspended structure 1220 and heat from the local heater 1210 stays trapped in the suspended structure 1220 for longer instead of more quickly dissipating through the Si substrate 940. Thus, to achieve a desired amount of thermal tuning, less heat is necessary for the structure 1200 than for the structure 1100.

Different processes may create the suspended structure 1220. For instance, first, the back side of the wafer is etched until the SiO$_2$ cladding 950 is reached. Second, the top side oxide is opened on two sides of the waveguide 470. Third, the Si substrate 940 is selectively etched underneath the SiO$_2$ cladding 950. Fourth, SiO$_2$ is deposited to seal the opening.

Figure 13:
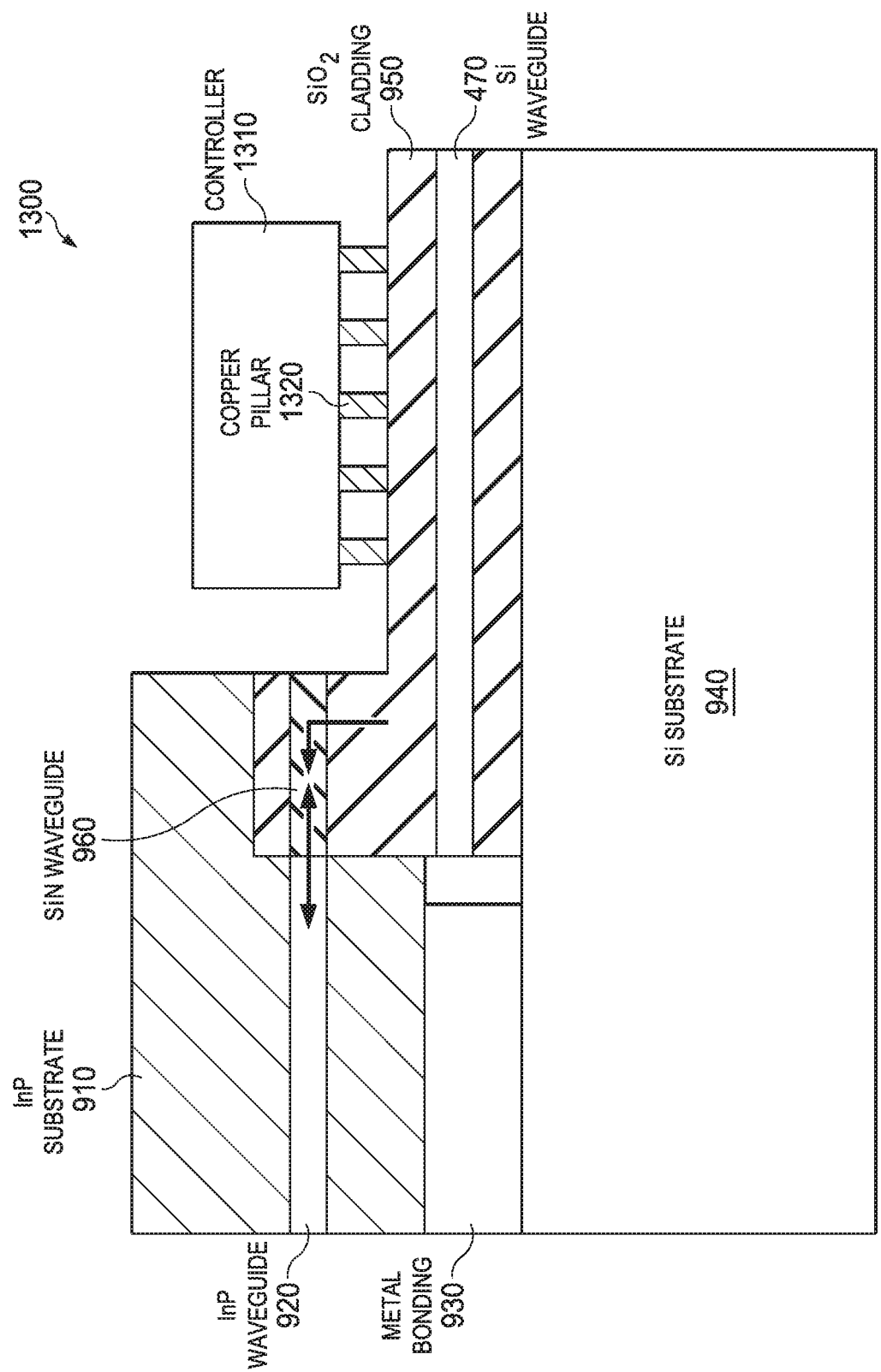
FIG. 13 is a schematic diagram of a chip package.

FIG. 13 is a schematic diagram of a chip package 1300. The chip package 1300 is similar to the coupler 410 shown in FIG. 9, except the chip package 1300 further comprises a controller 1310 coupled to the Si waveguide 470 via copper pillars 1320. The controller 1310 may comprise the device 300. The laser 400 comprises many components that need power or control. Those components require pins, so the pinout may become complex, particularly if the laser 400 is arrayed with other similar lasers on a single chip. Flip chip bonding the controller 1310 to the chip can significantly reduce the pinout because the controller 1310 can provide power and control to the components, while only a few pins are needed to provide power and control to the controller 1310.

Figure 14:
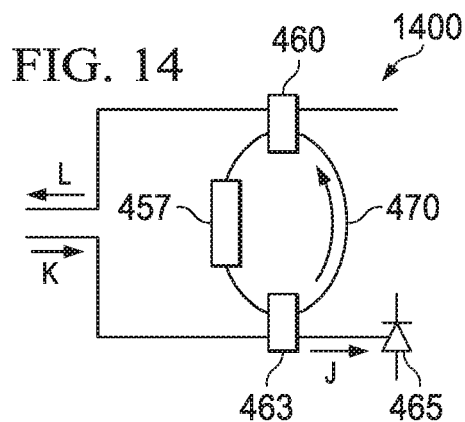
FIG. 14 is a schematic diagram of a portion of the CR in FIG. 4.

FIG. 14 is a schematic diagram of a portion 1400 of the CR 453 in FIG. 4. Light J has a radiant power of P$_J$, light K has a radiant power of P$_K$, and light L has a radiant power of P$_L$. T$_{CR}$, the transmittance of the CR 453, is expressed as follows:

$$T_{CR} = \frac{P_L}{P_K}. \tag{14}$$

It is desirable for T$_{CR}$ to be high. In other words, it is desirable for all of light K to exit as light L and none of light K to exit as light J. Thus, if the device 300 detects light J, the device 300 can instruct thermal tuning of the local heater 457 accordingly.

Figure 15:
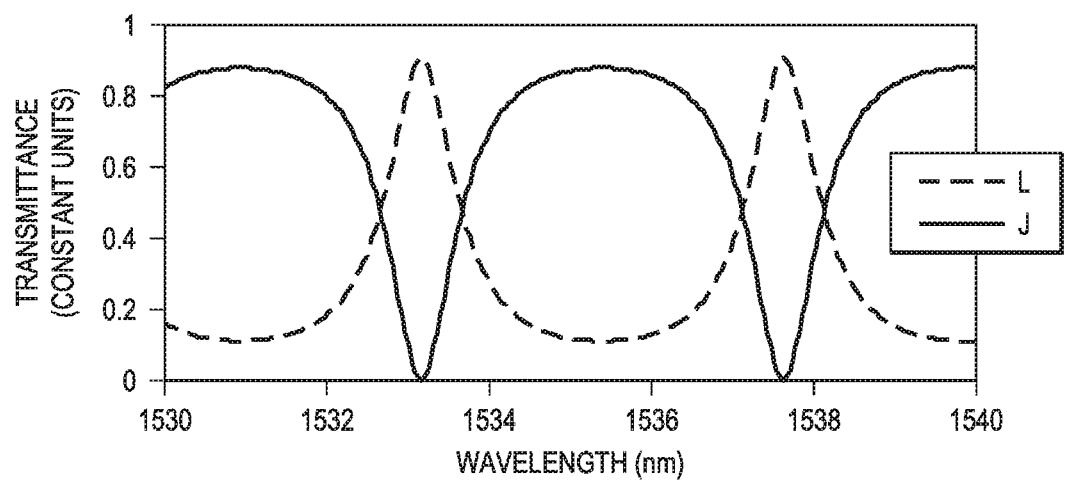
FIG. 15 is a graph of simulated transmittance of the CR in FIG. 4.

FIG. 15 is a graph 1500 of simulated transmittance of the CR 453 in FIG. 4. The x-axis represents wavelength in units of nanometers, and the y-axis represents transmittance in constant units. As shown, the transmittance of light L reaches its maxima when the transmittance of light J reaches its minima.

Figure 16:
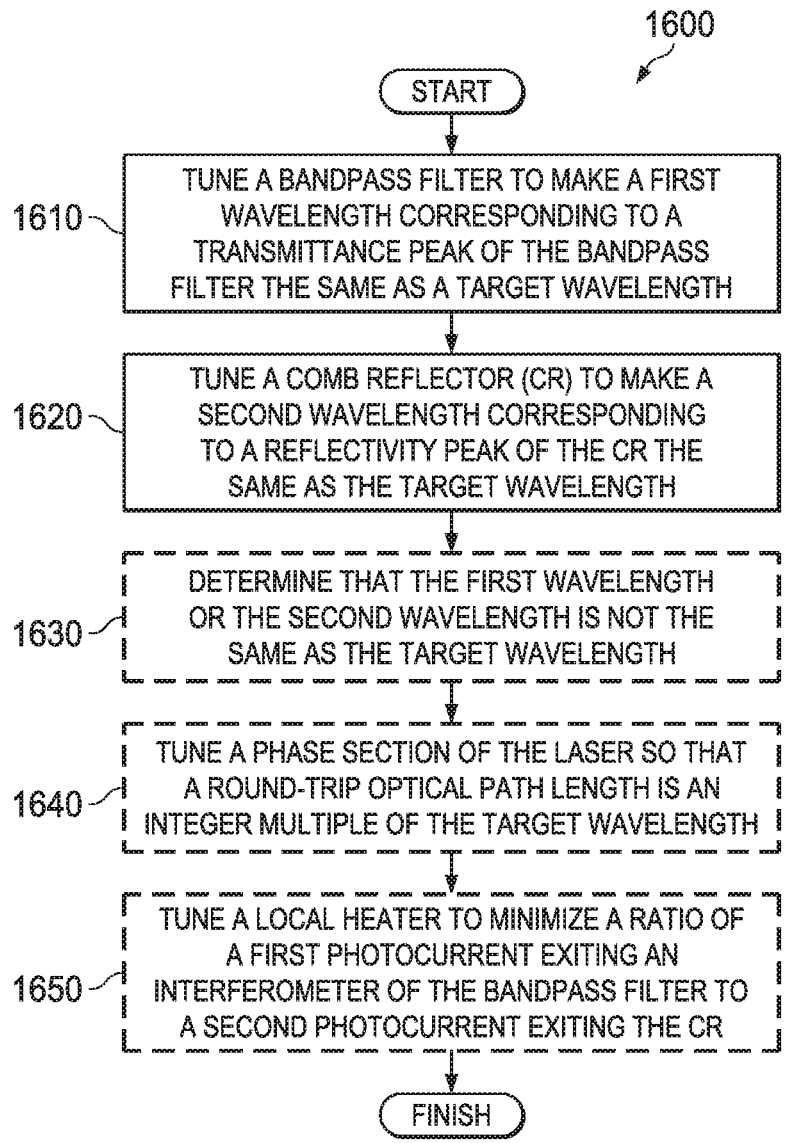
FIG. 16 is a flowchart illustrating a method of tuning a laser according to an embodiment of the disclosure.

FIG. 16 is a flowchart illustrating a method 1600 of tuning a laser according to an embodiment of the disclosure. The device 300 may implement the method 1600 in the laser 400. At step 1610, a bandpass filter is tuned to make a first wavelength corresponding to a transmittance peak of the bandpass filter the same as a target wavelength. For instance, the device 300 tunes the bandpass filter 420 to make a wavelength corresponding to T$_{BF,peak}$ the same as λ$_{target}$. At step 1620, a CR is tuned to make a second wavelength corresponding to a reflectivity peak of the CR the same as the target wavelength. For instance, the device 300 tunes the CR 453 to make a wavelength corresponding to R$_{CR,peak}$ the same as λ$_{target}$. At optional step 1630, it is determined that the transmittance peak or the reflectivity peak is not the same as the target wavelength. At optional step 1640, a phase section of the laser is tuned so that a round-trip optical path length is an integer multiple of the target wavelength. For instance, the device 300 tunes the phase section 413 to satisfy equation 12. Finally, at optional step 1650, a local heater is tuned to minimize a ratio of a first photocurrent exiting an interferometer of the bandpass filter to a second photocurrent exiting the CR. For instance, the device 300 tunes one of the local heaters 427, 440, 457 to minimize current$_D$/current$_I$.

The use of the term "about" means a range including ±10% of the subsequent number, unless otherwise stated. While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A laser comprising:
a gain medium comprising indium phosphide (InP);
a mirror coupled to the gain medium and comprising:
  a coupler coupled to the gain medium;
  a phase section coupled to the coupler;
  a bandpass filter coupled to the phase section;
  a comb reflector (CR) coupled to the bandpass filter; and
  a silicon (Si) waveguide;
a suspended structure local heater; and
a suspended structure thermally coupled to the suspended structure local heater, wherein the Si waveguide is positioned between the suspended structure local heater and the suspended structure.

2. The laser of claim 1, wherein the bandpass filter comprises:
a first Mach-Zehnder interferometer (MZI); and
a second MZI coupled to the first MZI and the CR.

3. The laser of claim 2, wherein the first MZI comprises:
a first splitter;
a first local heater coupled to the first splitter; and
a second splitter coupled to the first splitter and the first local heater.

4. The laser of claim 3, wherein the second MZI comprises:
a third splitter coupled to the second splitter;
a second local heater coupled to the third splitter; and
a fourth splitter coupled to the third splitter and the second local heater.

5. The laser of claim 1, wherein the CR comprises:
a first splitter coupled to the bandpass filter; and
a ring comprising:
  a second splitter coupled to the first splitter;
  a local heater coupled to the second splitter; and
  a third splitter coupled to the local heater and the second splitter.

6. The laser of claim 1, wherein the gain medium comprises a facet that is a thin-film coating reflector.

7. The laser of claim 1, wherein the phase section comprises a local heater and a p-n junction.

8. The laser of claim 1, further comprising:
a first photodiode (PD) coupled to the bandpass filter;
a second PD coupled to the bandpass filter;
a local heater coupled to the CR;
a third PD coupled to the local heater; and
a fourth PD coupled to the CR.

9. The laser of claim 1, wherein the gain medium is evanescently coupled to the mirror.

10. The laser of claim 1, further comprising a waveguide structure comprising:
an n-doped rib;
a positive electrode coupled to the n-doped rib;
a p-doped rib;
a ground electrode coupled to the p-doped rib; and
the silicon (Si) waveguide, wherein the Si waveguide is positioned between the n-doped rib and the p-doped rib to form a PIN diode.

11. A laser chip package comprising:
a substrate;
a laser coupled to the substrate and comprising:
  a filter comprising:
    a first interferometer with a first transmittance; and
    a second interferometer with a second transmittance, wherein the filter is configured to provide a filter transmittance based on the first transmittance and the second transmittance; and
  a comb reflector (CR) coupled to the filter and comprising:
    a ring with a circumference; and
    a refractive index, wherein the CR is configured to provide a CR reflectivity based on the circumference and the refractive index; and
a waveguide structure comprising:
  an n-doped rib;
  a positive electrode coupled to the n-doped rib;
  a p-doped rib;
  a ground electrode coupled to the p-doped rib; and
  a silicon (Si) waveguide positioned between the n-doped rib and the p-doped rib to form a PIN diode.

12. The laser chip package of claim 11, wherein the laser further comprises a mirror configured to provide a mirror reflectivity based on the filter transmittance and the CR reflectivity.

13. The laser chip package of claim 12, wherein the laser further comprises a gain section configured to provide a round-trip gain peak, wherein the mirror reflectivity has a mirror reflectivity peak, and wherein the laser is configured to lase at a wavelength based on the round-trip gain peak and the mirror reflectivity peak.

14. The laser chip package of claim 11, further comprising a phase section coupled to the filter and comprising:
a local heater configured to provide slower phase tuning; and
a p-n junction coupled to the local heater and the filter and configured to provide faster phase tuning.

15. A method of tuning a laser, the method comprising:
tuning a bandpass filter to make a first wavelength corresponding to a transmittance peak of the bandpass filter the same as a target wavelength;
tuning a comb reflector (CR) to make a second wavelength corresponding to a reflectivity peak of the CR the same as the target wavelength;
determining that the first wavelength or the second wavelength is not the same as the target wavelength;
tuning a phase section of the laser so that a round-trip optical path length is an integer multiple of the target wavelength; and
tuning a local heater to minimize a ratio of a first photocurrent exiting an interferometer of the bandpass filter to a second photocurrent exiting the CR.

16. The method of claim 15, wherein the tuning the bandpass filter and the tuning the CR provide coarse tuning, and wherein the determining, the tuning the phase section, and the tuning the local heater provide fine tuning.

17. The method of claim 16, further comprising:
performing the coarse tuning based on a lookup table generated before regular data communication begins; and performing the fine tuning based on a first photodiode (PD) measuring the first photocurrent and a second PD measuring the second photocurrent after regular data communications begin.

* * * * *